(12) United States Patent
Yamashita

(10) Patent No.: US 7,609,164 B2
(45) Date of Patent: Oct. 27, 2009

(54) RADIO TAG EVALUATION SYSTEM AND METHOD

(75) Inventor: Seiichi Yamashita, Saitama (JP)

(73) Assignee: Honda Motor Co., Ltd., Tokyo (JP)

( * ) Notice: Subject to any disclaimer, the term of this patent is extended or adjusted under 35 U.S.C. 154(b) by 335 days.

(21) Appl. No.: 11/508,263

(22) Filed: Aug. 23, 2006

(65) Prior Publication Data

US 2007/0046472 A1    Mar. 1, 2007

(30) Foreign Application Priority Data

Aug. 26, 2005    (JP) ............................. 2005-246252

(51) Int. Cl.
*G08B 13/14* (2006.01)

(52) U.S. Cl. .............. 340/572.7; 340/572.1; 340/568.1; 340/10.42

(58) Field of Classification Search ... 340/572.1–572.9, 340/568.1, 10.1, 10.3, 10.4, 10.41, 10.2, 340/10.42, 10.5, 10.51, 505, 522, 521, 5.1, 340/5.2, 571, 673

See application file for complete search history.

(56) References Cited

U.S. PATENT DOCUMENTS

| | | | | |
|---|---|---|---|---|
| 6,028,518 A | * | 2/2000 | Rankin et al. ............ | 340/572.1 |
| 6,079,619 A | * | 6/2000 | Teraura et al. ............. | 235/380 |
| 6,246,327 B1 | * | 6/2001 | Eberhardt ................ | 340/572.1 |
| 6,362,772 B1 | * | 3/2002 | Skotch et al. ................ | 342/42 |
| 6,693,539 B2 | * | 2/2004 | Bowers et al. ........... | 340/572.1 |
| 7,262,711 B2 | * | 8/2007 | Zhu et al. .................... | 340/928 |
| 7,336,563 B2 | * | 2/2008 | Holm ........................ | 367/118 |
| 2005/0212660 A1 | * | 9/2005 | Hansen et al. ............. | 340/10.3 |

FOREIGN PATENT DOCUMENTS

| | | | |
|---|---|---|---|
| JP | 2000-364138 | * | 11/2000 |
| JP | 2002-169858 A | | 6/2002 |
| JP | 2004-347443 A | | 12/2004 |

* cited by examiner

*Primary Examiner*—Benjamin C Lee
*Assistant Examiner*—Daniel Previl
(74) *Attorney, Agent, or Firm*—Birch, Stewart, Kolasch & Birch, LLP

(57) ABSTRACT

A radio tag evaluation system includes a transmission member providing a frequency signal to a radio tag. A transmitting antenna, which is placed on one side of the radio tag for transmiting the inquiry signal supplied from the transmission member. The radio tag is placed and supported around the center of an anechoic box. A receiving antenna is placed on the other side of the radio tag. A reception member is connected to the receiving antenna for analyzing a response signal. The transmitting antenna and the receiving antenna are placed orthogonally to each other, and the primary face of the radio tag is placed substantially at an angle of 45 degrees with respect to the transmitting antenna. The receiving antenna is unable to directly receive a transmission radio wave which has passed around the radio tag. Accordingly, a response signal emitted from the radio tag can be relatively strongly received.

18 Claims, 4 Drawing Sheets

RADIO TAG EVALUATION SYSTEM AND METHOD

CROSS-REFERENCE TO RELATED APPLICATIONS

The present application claims priority under 35 USC 119 to Japanese Patent Application No. 2005-246252 filed on Aug. 26, 2005 the entire contents of which are hereby incorporated by reference.

BACKGROUND OF THE INVENTION

1. Field of the Invention

The present invention relates to a radio tag evaluation system and a radio tag evaluation method. More specifically, to a radio tag evaluation system and a radio tag evaluation method which are easily and accurately capable of evaluating performances of various types of radio tags.

2. Description of Background Art

As a system for reading information, which is given to individual objects or the like, without touching the same, a management system using radio tags (IC tags, RFIDs) has been studied.

Japanese Patent Laid-open publication No. 2004-347443 discloses an inspection system including a transmitting antenna transmitting radio waves, a receiving antenna receiving waves reflected off a target to which the radio waves are transmitted, and a display unit displaying conditions of the radio waves received by the receiving antenna. With the inspection system, radio wave reflection properties and the like of the target, to which the radio waves are transmitted, can be verified, and the conditions of installation of the target, to which the radio waves are transmitted, and which is buried in the ground, can be also verified.

Japanese Patent Laid-open publication No. 2002-169858 discloses an article management method in which tags each including an IC chip are individually attached to articles, the IC chip storing specific information which is different from one article to another to be managed. According to the management method, the articles with the tags attached thereto can be managed consistently from a manufacturing process to disposal without losing the tags.

In cases wherein the radio tags are attached respectively to components on a manufacturing site for process management, quality management and the like and in a case where the radio tags are attached to articles in a retail store for article management and the like, all of the products or articles are not given the radio tags of the same type, and it is assumed that various types of radio tags are mixed. On the other hand, the performance of the radio tags transmitting data, which are stored in the IC chips, varies depending on manufacturers and specifications thereof. Accordingly, it is desirable that an existing radio tag reader can read the information on the manufacturing site or in the retail store, wherein only radio tags meeting a predetermined criterion are handled.

However, the technologies of Japanese Patent Laid-open publication No. 2004-347443 and Japanese Patent Laid-open publication No. 2002-169858 are primarily aimed at actually using the radio tags, and do not include any suggestions or considerations concerning technologies for easily and accurately measuring the performances of a number of radio tags.

SUMMARY AND OBJECTS OF THE INVENTION

An object of the present invention is to solve the aforementioned problem of the conventional arts, and to provide a radio tag evaluation system and an evaluation method thereof, which are capable of accurately measuring the performance of radio tags with a simple structure for evaluation.

To achieve the aforementioned object, in a radio tag evaluation system evaluating a radio tag on the basis of a response signal outputted in response to an inquiry signal, an embodiment of the present invention includes transmission means providing, as a transmission wave, a frequency signal including the inquiry signal to the radio tag and a transmitting antenna which is placed at a predetermined distance from the radio tag on one side of the radio tag, and which transmits the inquiry signal supplied from the transmission means. The radio tag is placed around the center of an anechoic box. A receiving antenna is placed at a predetermined distance from the radio tag on the other side of the radio tag for receiving the response signal transmitted from the radio tag in response to the inquiry signal. Reception means are connected to the receiving antenna for analyzing the response signal.

According to an embodiment of the present invention, the transmitting antenna and the receiving antenna are placed orthogonally to each other wherein a primary face of the radio tag is placed substantially at 45 degrees to the transmitting antenna and the receiving antenna.

According to an embodiment of the present invention, each of the transmitting and receiving antennas is a dipole antenna with a length equal to half of a wavelength of the transmission wave.

According to an embodiment of the present invention, the radio tag evaluation system further includes distribution means distributing the transmission wave, which is transmitted from the transmission means, to a side of the transmitting antenna and the other side thereof with conversion means for converting a phase and amplitude of part of the transmission wave distributed to the other side. Addition means are provided for adding the part of the transmission wave converted by the conversion means to a wave received by the receiving antenna.

According to an embodiment of the present invention, the conversion means imparts an opposite phase to the transmission wave distributed to the other side, the opposite phase being opposite to the phase of a signal obtained by eliminating the response signal from the signal inputted from the receiving antenna to the addition means.

According to an embodiment of the present invention, the conversion means adjusts the amplitude of the part of the transmission wave, which is distributed to the other side, to the same amplitude or to the substantially same amplitude as the amplitude of the signal obtained by eliminating the response signal from the signal inputted from the receiving antenna to the addition means.

According to an embodiment of the present invention, the reception means is a time series spectrum analyzer.

According to an embodiment of the present invention, a radio tag evaluation method for evaluating a radio tag on the basis of a response signal outputted in response to the inquiry signal includes the steps of placing the radio tag around the center of the anechoic box, placing the transmitting antenna at a predetermined distance from the radio tag on one side of the radio tag, placing the receiving antenna at a predetermined distance from the radio tag on the other side of the radio tag; transmitting the inquiry signal to the radio tag from the transmission means connected to the transmitting antenna and analyzing the response signal with the reception means connected to the receiving antenna.

According to an embodiment of the present invention, the reception means is the time series spectrum analyzer.

According to an embodiment of the present invention, the performance evaluation of the radio tag may be performed easily without using a special part and the like.

According to an embodiment of the present invention, the inquiry signal received by the radio tag is attenuated by about 3 dB, and the response signal received by the receiving antenna is attenuated by about 3 dB. On the other hand, by use of the anechoic box, the transmission wave received by the receiving antenna can be attenuated by about 30 dB. Accordingly, the D/U ratio is increased, and the response signal from the radio tag can be received relatively strongly. The analysis by the reception means, i.e., the performance evaluation of the radio tag can be therefore performed more easily.

According to an embodiment of the present invention, by placing the antennas orthogonally to each other, isolation of a directional pattern can be easily obtained. Thus, the radio tag evaluation system can be easily constituted.

According to an embodiment of the present invention, it is possible to impose a change by electrical means on the part of the transmission wave unnecessary for the analysis of the response signal at the reception means without modifying the arrangement, angles, and the like of each of the radio tag, and the transmitting and receiving antennas.

According to an embodiment of the present invention, the part of the transmission wave that is unnecessary for the analysis of the response signal at the reception means can be reduced by the electrical means. This allows the performance evaluation of the radio tag to be more accurately performed.

According to an embodiment of the present invention, the frequency of the response signal can be analyzed in time series, thus allowing a more detailed analysis. Accordingly, it is possible to easily judge whether or not the performance of the radio tag is good.

According to an embodiment of the present invention, it is possible to obtain an evaluation method for relatively easily evaluating the performance of the radio tag in time series.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
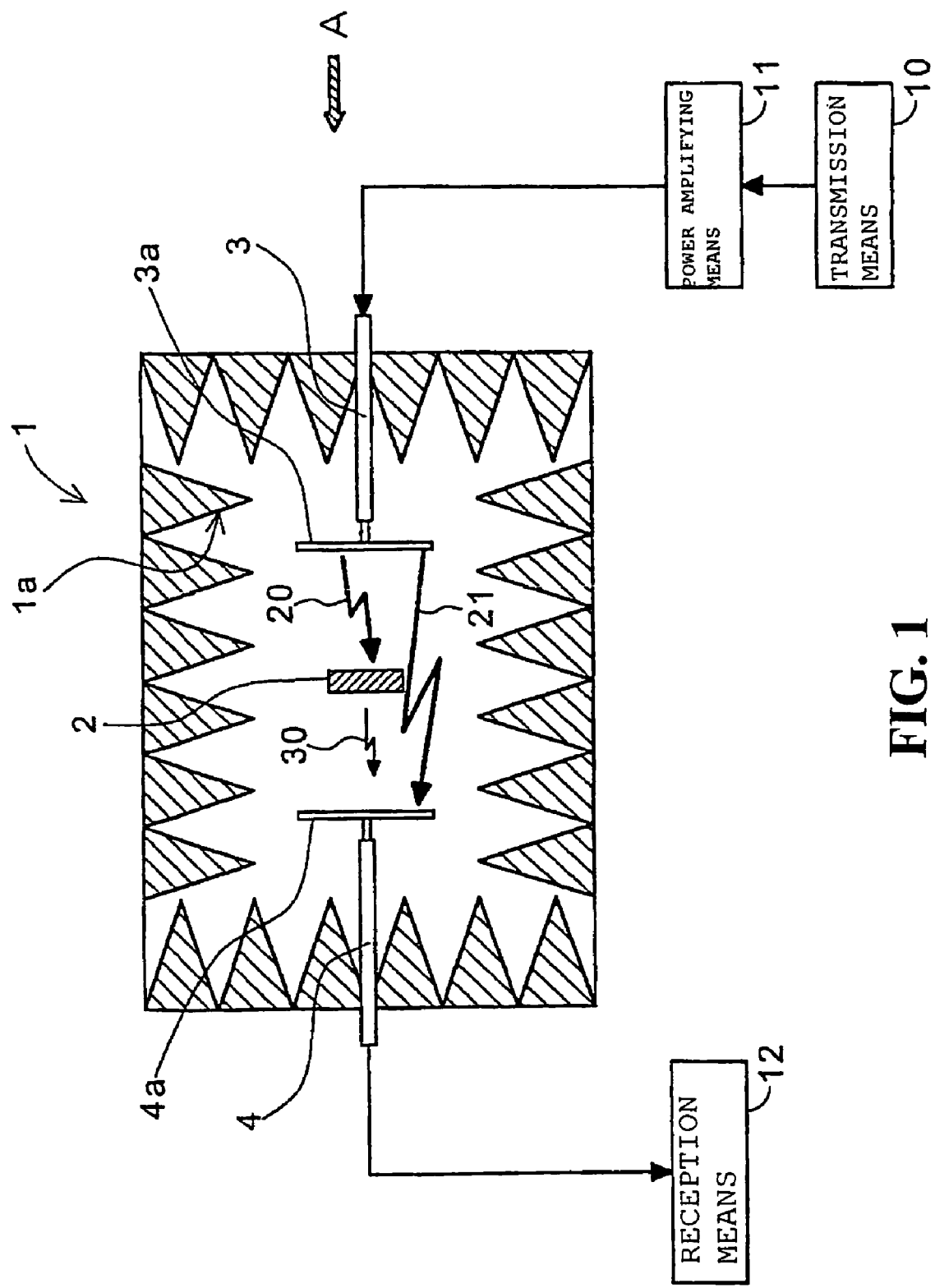
FIG. 1 is a schematic explanatory view showing a configuration of a radio tag evaluation system according to a first embodiment of the present invention.

Hereinafter, a detailed description is given for embodiments of the present invention with reference to the accompanying drawings. FIG. 1 is a schematic explanatory view showing a configuration of a radio tag evaluation system according to a first embodiment of the present invention. An anechoic box 1 is a radio wave absorbing unit of a substantially rectangular solid which includes a number of pyramid-shaped radio wave absorbers 1a disposed on inner walls thereof. This schematic explanatory view shows the inside of the anechoic box 1 viewed horizontally to the ground. A radio tag 2, which is mainly composed of an IC chip and an antenna (a highly directive antenna, such as a dipole antenna, a horn antenna, or a patch antenna, is preferred), is supported substantially in the center of the anechoic box 1, and is supported so that a primary surface (antenna surface) thereof is vertical or substantially vertical. Interposing the radio tag 2 in between, to the right, a transmitting antenna 3 is placed at a predetermined distance from the radio tag 2, and to the left, a receiving antenna 4 is placed in a similar manner. Dipole antennas are suitable for the transmitting antenna 3 and the receiving antenna 4. Length of each of pole sections 3a and 4a is set equal to a half of wavelength of transmission radio waves. Moreover, the transmitting antenna 3 is connected to power amplifying means 11 for amplifying a frequency signal including an inquiry signal supplied from transmission means 10 as a reader of the radio tag 2. Furthermore, the receiving antenna 4 is connected to reception means 12 performing various analyses for the frequency of the radio waves.

Hereinafter, a description is given for a procedure of an operation of the radio tag evaluation system according to the embodiment. When the frequency signal including the inquiry signal is outputted from the transmission means 10 as a reader of the radio tag 2, this frequency signal is amplified by the amplifying means 11 and supplied to the transmitting antenna 3. From the transmitting antenna 3, the frequency signal is emitted toward the receiving antenna 4 as transmission radio waves 20 and 21. Upon receiving the transmission radio wave 20 with a built-in antenna unit, the radio tag 2 causes the IC chip to be activated by an electromotive force generated with the principle of electromagnetic induction and concurrently emits a response signal 30 corresponding to the inquiry signal. This response signal 30 is received by the receiving antenna 4 and inputted to the reception means 12. In this embodiment, a time series spectrum analyzer is used for the reception means 12. The time series spectrum analyzer is well-known equipment, a detailed description of which is omitted. The time series spectrum analyzer enables an analysis on the frequency axis and an analysis on the time axis to be performed concurrently for the frequency of received radio waves. The frequency of the response signal 30 is therefore analyzed in detail, and it is made possible to judge whether or not the performance of the radio tag 2 is good. According to the aforementioned configuration, the radio tag can be easily evaluated without using special parts.

However, not only the response signal 30 from the radio tag 2 but also the transmission radio wave 21 are inputted to the receiving antenna 4, the transmission radio wave 21 having passed around the radio tag 2, and having directly reached the receiving antenna 4. The intensity of this transmission radio wave 21 is higher than that of the response signal 30. Accordingly, the D/U (desired to undesired signal) ratio is reduced, thus it is difficult in some cases to obtain enough resolution of the response signal 30 for the reception means 12 to evaluate the performance of the radio tag 2. Hereinafter, a description is given for an embodiment taking account of the above problem.

Figure 2:
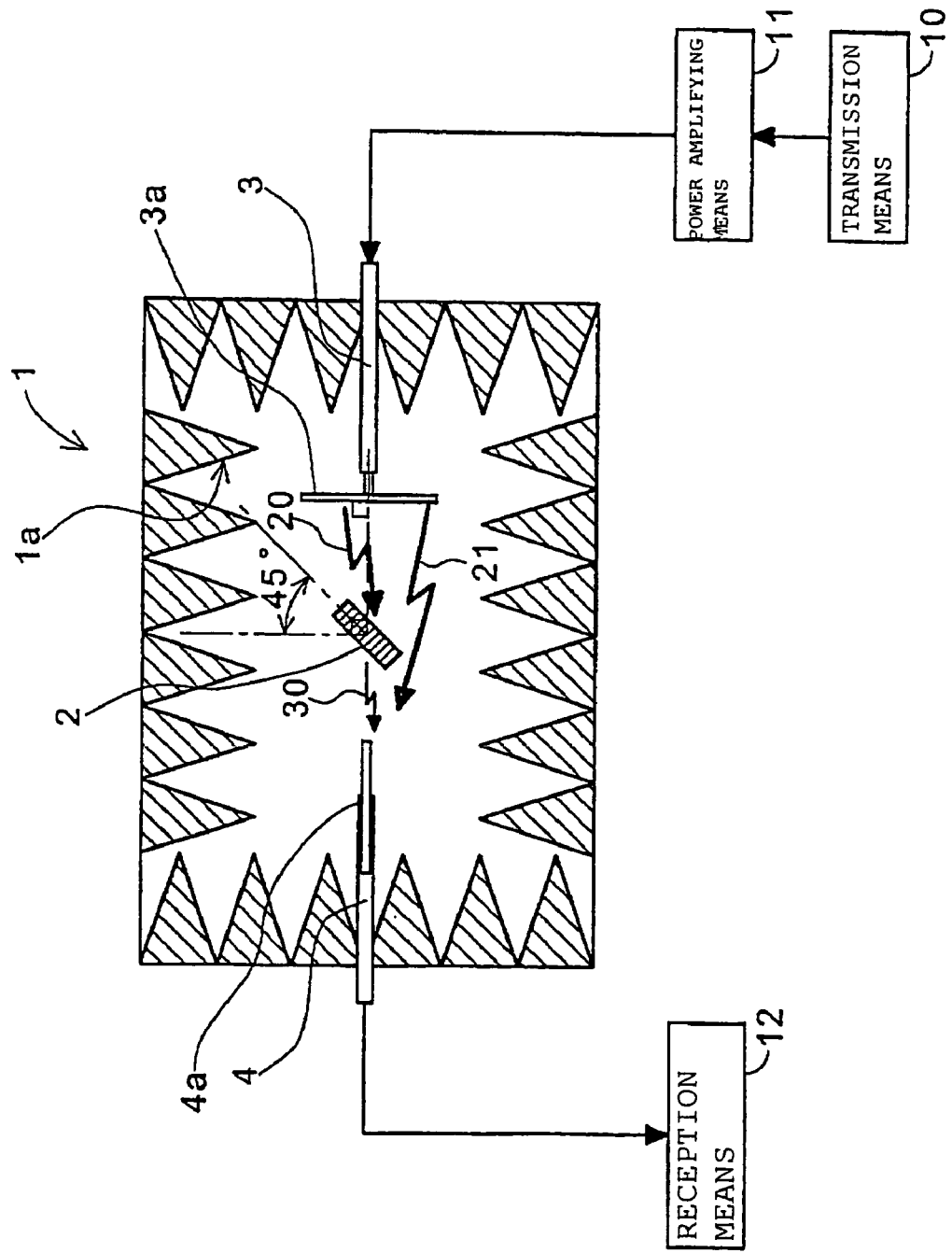
FIG. 2 is a schematic explanatory view showing a configuration of a radio tag evaluation system according to a second embodiment of the present invention.

FIG. 2 is a schematic explanatory view showing a configuration of a radio tag evaluation system according to a second embodiment of the present invention. The reference numerals, which are the same as those of the above embodiment, indicate the same or similar portions. In this embodiment, the pole section 3a of the transmitting antenna 3 is disposed so as to face in a direction vertical to the ground, and the pole section 3b of the receiving antenna 4 is disposed so as to face in a direction horizontal to the ground. More specifically, the pole sections 3a and 4a are arranged so that a plane of polarization of the pole section 3a of the transmitting antenna 3 is orthogonal to a plane of polarization of the pole section 4b of the receiving antenna 4. On the other hand, the radio tag 2 is disposed so that a plane of polarization thereof is tilted and placed at 45 degrees or substantially 45 degrees with respect to the vertical direction. When the radio tag 2 is tilted in this manner, the transmission radio wave 20 received by the radio tag 2 is attenuated by about 3 dB compared to the state where the transmission radio wave 20 is emitted from the transmission antenna 3. In other words, power induced in the radio tag 2 is about 3 dB lower than transmission power. Similarly, the pole section 4a of the receiving antenna 4 is placed horizontally, and the response signal 30 received by the receiving antenna 4 is attenuated by about 3 dB compared to power emitted from the radio tag 2.

On the other hand, the transmission radio wave 21, which has passed around the radio tag 2, is not directly received by the receiving antenna 4 but is received by the receiving antenna 4 as a reflected wave, which is reflected on the inner walls of the anechoic box 1. At this time, the receiving antenna 4 receives the transmission radio wave attenuated by about 30 dB compared to the transmission radio wave at the time of emission.

According to this embodiment, the response signal 30 received by the receiving antenna 4 from the radio tag 2 is attenuated by about 6 dB compared to that in the first embodiment. However, the transmission wave 21, which is unnecessary for the analysis of the response signal 30, is significantly attenuated by about 30 dB. Accordingly, the receiving antenna 4 can relatively strongly receive the response signal 30. In other words, the D/U ratio is increased. Thus, compared to the first embodiment, the analysis of the response signal 30 by the reception means 12, that is, the performance evaluation of the radio tag 2, may be accurately and easily performed.

Figure 3:
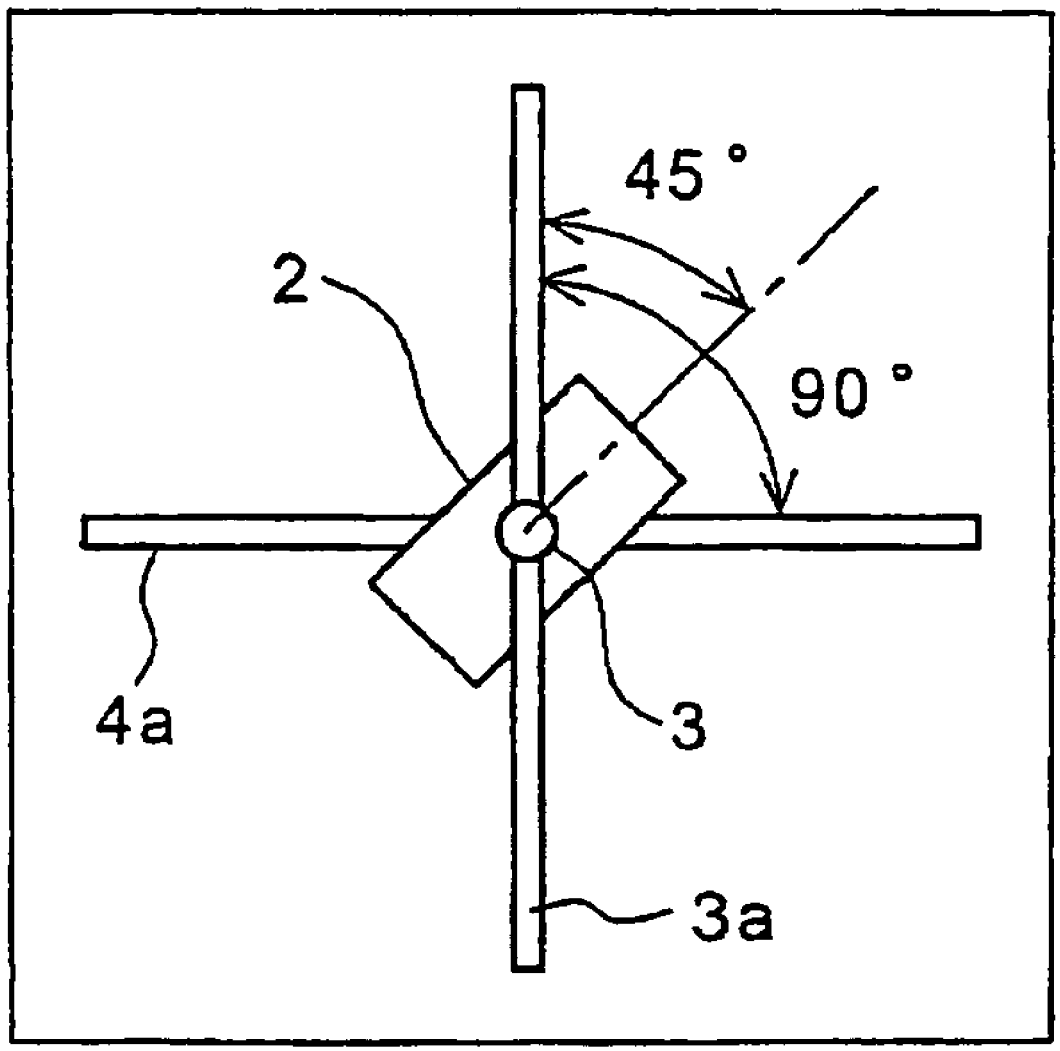
FIG. 3 is a view showing a positional relationship among the radio tag and transmitting and receiving antennas according to a modification of the second embodiment of the present invention.

FIG. 3 shows a positional relationship among the radio tag, the transmitting antenna and the receiving antenna of a radio tag evaluation system according to a modification of the second embodiment of the present invention. FIG. 3 is a view in a direction indicated by an arrow A of FIG. 1. In this embodiment, with respect to the pole section 3a of the transmitting antenna 3, which is disposed perpendicular to the ground, the radio tag 2 is rotated to the right by 45 degrees, and the pole section 4a of the receiving antenna 4 is rotated to the right by 90 degrees. Such an arrangement produces an effect similar to that of the arrangement of the aforementioned second embodiment. Accordingly, among the radio waves received by the receiving antenna 4, the response signal 30 (not shown) from the radio tag 2 is attenuated by about 6 dB, but the transmission wave 21 (not shown), which is unnecessary for the analysis of the response signal 30, is attenuated by about 30 dB. The receiving antenna 4 can, therefore, relatively strongly receive the response signal 30.

It should be noted that the arrangement and angles of the transmitting antenna 3, the receiving antenna 4 and radio tag 2 are not limited to those of the aforementioned embodiments, and various modifications can be made. Moreover, the radio tag evaluation system and method according to the present invention can be used without limiting a transmission type of the radio tag (an electromagnetic coupling type, an electromagnetic induction type, a radio wave type, and the like).

Figure 4:
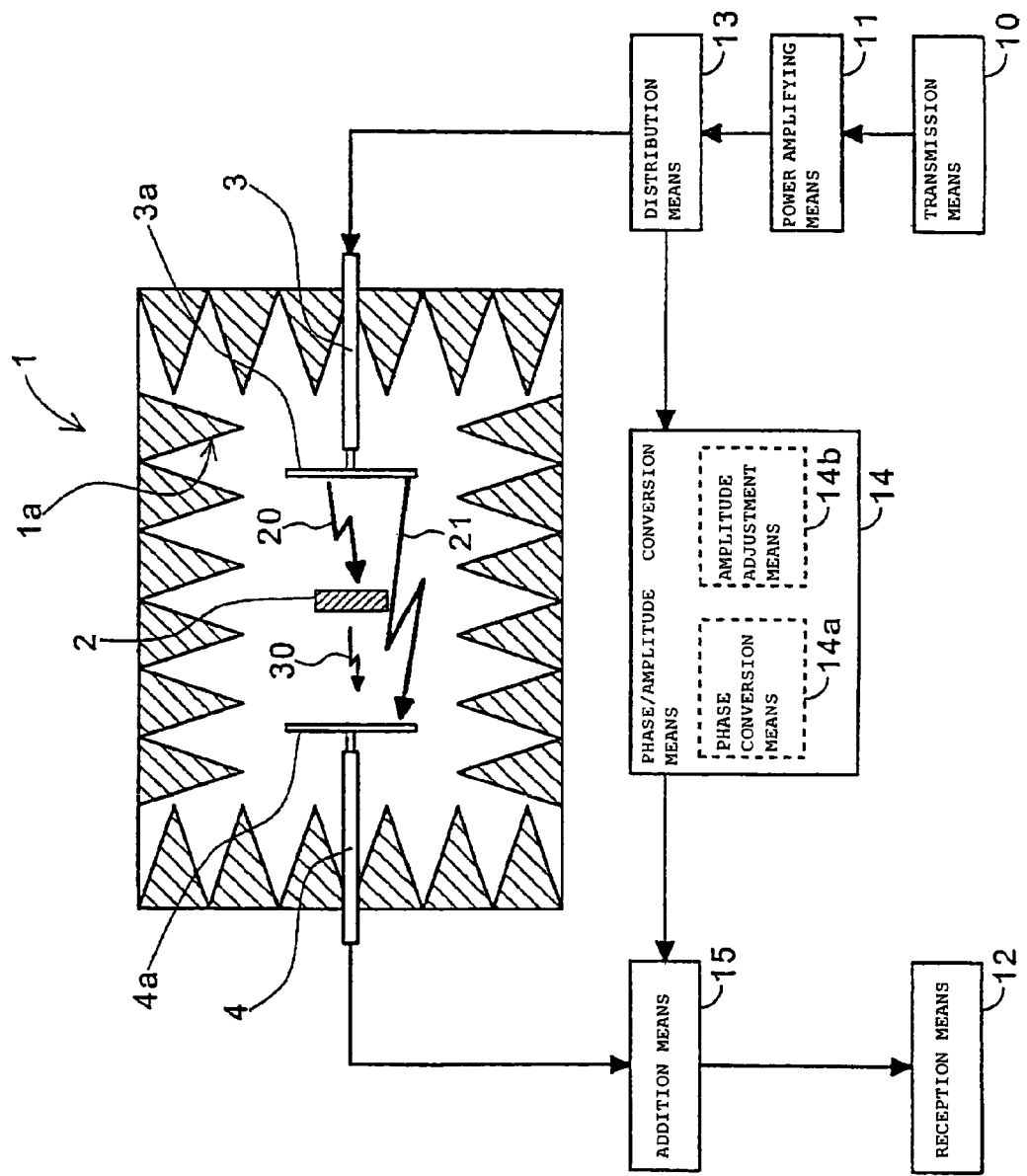
FIG. 4 is a schematic explanatory view showing a configuration of a radio tag evaluation system according to a third embodiment of the present invention.

FIG. 4 shows a configuration of a radio tag evaluation system according to a third embodiment of the present invention. The reference numerals, which are the same as those of the above embodiments indicate the same or similar portions. The arrangement of the transmitting antenna 3, the radio tag 2, the receiving antenna 4, and the like is the same as that of the first embodiment. This embodiment is characterized in that the transmission radio wave 21, which is unnecessary for the analysis of the response signal 30, is reduced by electrical processing. To perform this processing, in this embodiment, distribution means 13, phase/amplitude conversion means 14 as conversion means, and addition means 15 are provided in addition to the configuration of the first embodiment. The phase/amplitude conversion means 14 includes phase conversion means 14a and amplitude adjustment means 14b. First, when the frequency signal including the inquiry signal is outputted from the transmission means 10, this frequency signal is amplified by the power amplifying means 11 and then inputted to the distribution means 13. The distribution means 13 distributes and supplies the inputted frequency signal to the transmitting antenna 3 and the phase/amplitude conversion means 14.

The frequency signal supplied to the transmitting antenna 3 by the distribution means 13 is received by the radio tag 2 in the same way as that of the first embodiment. The radio tag 2 thereby emits the response signal 30. The receiving antenna 4 receives this response signal 30 and the transmission radio wave 21 which has passed around the radio tag 2, and the received signal is inputted to the addition means 15.

On the other hand, the frequency signal supplied to the phase/amplitude conversion means 14 by the distribution means 13 is processed by the phase conversion means 14a and the amplitude adjustment means 14b and then inputted to the addition means 15. First, the phase conversion means 14a performs processing to convert the phase of the frequency signal so that the phase thereof is opposite to that of the transmission radio wave 21, which is inputted from the receiving antenna 4 to the addition means 15. The amplitude adjustment means 14b performs processing to adjust the amplitude of the frequency signal so that the amplitude thereof is equal to that of the transmission radio wave 21, which is inputted from the receiving antenna 4 to the addition means. More specifically, the frequency signal supplied to the phase/amplitude conversion means 14 is converted to a signal having an amplitude equal to, and a phase opposite to, those of the transmission radio wave 21, which is inputted to the addition means 15 from the receiving antenna 4. Thereafter, the frequency signal is inputted to the addition means 15.

The addition means 15 performs addition of the received signal and the frequency signal converted by the phase/amplitude conversion means 14. At this time, the transmission radio wave 21 of the directly received signal is cancelled by the frequency signal converted by the phase/amplitude conversion means 14, and attenuated substantially to zero. On the other hand, the response signal 30 does not have amplitude equal to, and a phase opposite to, those of the transmission radio wave 21, and is not cancelled by the frequency signal converted by the phase/amplitude conversion means 14. Accordingly, only the response signal 30 is outputted to the reception means 12, and the performance evaluation of the radio tag 2 can be performed more easily and accurately.

Incidentally, it is obvious that the configuration of the aforementioned third embodiment may be combined with, for example, the arrangement of the transmitting and receiving antennas and radio tag, which is shown in the aforementioned second embodiment, and the like.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A radio tag evaluation system evaluating a radio tag on the basis of a response signal outputted in response to an inquiry signal, the system comprising:
   transmission means providing, as a transmission wave, a frequency signal which includes the inquiry signal to the radio tag;
   a transmitting antenna, which is placed at a predetermined distance from the radio tag on one side of the radio tag, and which transmits the inquiry signal supplied from the transmission means, the radio tag being placed around the center of an anechoic box;
   a receiving antenna, which is placed at a predetermined distance from the radio tag on the other side of the radio tag, and which receives the response signal transmitted from the radio tag in response to the inquiry signal;
   reception means, which is connected to the receiving antenna, and which analyzes the response signal,
   distribution means distributing the transmission wave transmitted from the transmission means to a side of the transmitting antenna and the other side thereof;
   conversion means converting a phase and amplitude of part of the transmission wave distributed to the other side; and
   addition means adding the part of the transmission wave converted by the conversion means to a wave received by the receiving antenna,
   wherein the receiving antenna is separate from the transmitting antenna, and
   when a frequency of the response signal is analyzed, the system is adapted to judge whether or not performance of the radio tag is good.

2. The radio tag evaluation system according to claim 1, wherein the reception means is a time series spectrum analyzer.

3. A radio tag evaluation system evaluating a radio tag on the basis of a response signal outputted in response to an inquiry signal, the system comprising:
   transmission means providing, as a transmission wave, a frequency signal which includes the inquiry signal to the radio tag;
   a transmitting antenna, which is placed at a predetermined distance from the radio tag on one side of the radio tag, and which transmits the inquiry signal supplied from the transmission means, the radio tag being placed around the center of an anechoic box;
   a receiving antenna, which is placed at a predetermined distance from the radio tag on the other side of the radio tag, and which receives the response signal transmitted from the radio tag in response to the inquiry signal;
   reception means, which is connected to the receiving antenna, and which analyzes the response signal;
   distribution means distributing the transmission wave transmitted from the transmission means to a side of the transmitting antenna and the other side thereof;
   conversion means converting a phase and amplitude of part of the transmission wave distributed to the other side; and
   addition means adding the part of the transmission wave converted by the conversion means to a wave received by the receiving antenna.

4. The radio tag evaluation system according to claim 3, wherein the transmitting and receiving antennas are placed orthogonally to each other, and
   wherein a primary face of the radio tag is placed substantially at 45 degrees to the transmitting and receiving antennas.

5. The radio tag evaluation system according to claim 4, wherein the transmitting antenna and the receiving antenna are dipole antennas with a length equal to half of a wavelength of the transmission wave.

6. The radio tag evaluation system according to claim 4, wherein the reception means is a time series spectrum analyzer.

7. The radio tag evaluation system according to claim 3, wherein the transmitting antenna and the receiving antenna are dipole antennas with a length equal to half of a wavelength of the transmission wave.

8. The radio tag evaluation system according to claim 7, wherein the reception means is a time series spectrum analyzer.

9. The radio tag evaluation system according to claim 3, wherein the conversion means imparts an opposite phase to the part of the transmission wave distributed to the other side, the opposite phase being opposite to that of a signal obtained by eliminating the response signal from the signal received from the receiving antenna to the addition means.

10. The radio tag evaluation system according to claim 9, wherein the conversion means adjusts the amplitude of the part of the transmission wave, which is distributed to the other side, to the same amplitude or to the substantially same amplitude as the amplitude of the signal obtained by eliminating the response signal from the signal received from the receiving antenna to the addition means.

11. The radio tag evaluation system according to claim 10, wherein the reception means is a time series spectrum analyzer.

12. The radio tag evaluation system according to claim 9, wherein the reception means is a time series spectrum analyzer.

13. The radio tag evaluation system according to claim 3, wherein the reception means is a time series spectrum analyzer.

14. A radio tag evaluation system adapted to evaluate a radio tag on the basis of a response signal outputted in response to an inquiry signal, the system comprising:
   a transmission member providing a frequency signal which includes the inquiry signal;
   a transmitting antenna positioned at a predetermined distance from a radio tag for transmitting the inquiry signal supplied from the transmission member;
   a receiving antenna positioned at a predetermined distance from the transmitting antenna on another side of a radio tag from the transmitting antenna for receiving the response signal transmitted from a radio tag in response to the inquiry signal;
   a reception member being connected to the receiving antenna for analyzing the response signal, distribution means distributing the transmission wave transmitted from the transmission means to a side of the transmitting antenna and the other side thereof;

conversion means converting a phase and amplitude of part of the transmission wave distributed to the other side; and addition means adding the part of the transmission wave converted by the conversion means to a wave received by the receiving antenna, wherein the receiving antenna is separate from the transmitting antenna, and when a frequency of the response signal is analyzed, the system is adapted to judge whether or not performance of the radio tag is good.

15. The radio tag evaluation system according to claim 14, wherein the transmitting and receiving antennas are placed orthogonally to each other, and wherein a primary face of a radio tag is placed substantially at 45 degrees to the transmitting and receiving antennas.

16. The radio tag evaluation system according to claim 14, wherein the transmitting antenna and the receiving antenna are dipole antennas with a length equal to half of a wavelength of the transmission wave.

17. A radio tag evaluation method for evaluating a radio tag on the basis of a response signal outputted in response to an inquiry signal, comprising the steps of:

placing the radio tag around the center of an anechoic box;

placing a transmitting antenna at a predetermined distance from the radio tag on one side of the radio tag;

placing a receiving antenna at a predetermined distance from the radio tag on the other side of the radio tag;

transmitting the inquiry signal to the radio tag from transmission means connected to the transmitting antenna;

analyzing the response signal with reception means connected to the receiving antenna, distributing the transmission wave transmitted from the transmission means to a side of the transmitting antenna and the other side thereof;

converting a phase and amplitude of part of the transmission wave distributed to the other side; and adding the part of the transmission wave converted by the conversion means to a wave received by the receiving antenna, wherein the receiving antenna is separate from the transmitting antenna, and when a frequency of the response signal is analyzed, the system is adapted to judge whether or not performance of the radio tag is good.

18. The radio tag evaluation method according to claim 17, wherein the reception means is a time series spectrum analyzer.

* * * * *